(12) United States Patent
Lusky et al.

(10) Patent No.: US 7,457,183 B2
(45) Date of Patent: *Nov. 25, 2008

(54) OPERATING ARRAY CELLS WITH MATCHED REFERENCE CELLS

(75) Inventors: Eli Lusky, Tel-Aviv (IL); Boaz Eitan, Ra'anana (IL); Guy Cohen, Yaad (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 11/580,995

(22) Filed: Oct. 16, 2006

(65) Prior Publication Data

US 2007/0133276 A1    Jun. 14, 2007

Related U.S. Application Data

(63) Continuation of application No. 11/194,394, filed on Aug. 1, 2005, now Pat. No. 7,123,532, which is a continuation-in-part of application No. 10/662,535, filed on Sep. 16, 2003, now Pat. No. 6,954,393.

(51) Int. Cl.
*G11C 7/02*    (2006.01)
(52) U.S. Cl. .................. 365/210.1; 365/185.03
(58) Field of Classification Search .......... 365/210, 365/185.03, 185.2
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |

(Continued)

FOREIGN PATENT DOCUMENTS

EP    0 656 628    6/1995

(Continued)

OTHER PUBLICATIONS

U.S. Appl. No. 08/902,890, Jul. 30, 1997, Eitan.

(Continued)

*Primary Examiner*—Vu A Le
(74) *Attorney, Agent, or Firm*—EMPK & Shiloh, LLP

(57) ABSTRACT

A method for reading a bit of a memory cell in a non-volatile memory (NVM) cell array, the method comprising providing a memory cell comprising a bit to be read and at least one other bit not to be read, and reading the bit to be read with respect to a multi-bit reference cell, the reference cell comprising a first bit at a first non-ground programmed state and a second bit at a second non-ground programmed state. Compared with the prior art, the present invention may enable achieving an improved sensing accuracy together with improved read disturb immunity.

26 Claims, 3 Drawing Sheets

U.S. PATENT DOCUMENTS

| | | |
|---|---|---|
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,386,417 A | 5/1983 | Collins |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |

| Patent | Date | Inventor |
|---|---|---|
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,650,959 A | 7/1997 | Hayashi et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,666,365 A | 9/1997 | Kostreski |
| 5,672,959 A | 9/1997 | Der |
| 5,675,280 A | 10/1997 | Nomura |
| 5,677,867 A | 10/1997 | Hazani |
| 5,677,869 A | 10/1997 | Fazio et al. |
| 5,683,925 A | 11/1997 | Irani et al. |
| 5,689,459 A | 11/1997 | Chang et al. |
| 5,694,356 A | 12/1997 | Wong et al. |
| 5,696,929 A | 12/1997 | Hasbun et al. |
| 5,708,608 A | 1/1998 | Park et al. |
| 5,712,814 A | 1/1998 | Fratin et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,721,781 A | 2/1998 | Deo et al. |
| 5,726,946 A | 3/1998 | Yamagata et al. |
| 5,748,534 A | 5/1998 | Dunlap et al. |
| 5,751,037 A | 5/1998 | Aozasa et al. |
| 5,751,637 A | 5/1998 | Chen et al. |
| 5,754,475 A | 5/1998 | Bill et al. |
| 5,760,445 A | 6/1998 | Diaz |
| 5,760,634 A | 6/1998 | Fu |
| 5,768,192 A | 6/1998 | Eitan |
| 5,768,193 A | 6/1998 | Lee et al. |
| 5,771,197 A | 6/1998 | Kim |
| 5,774,395 A | 6/1998 | Richart et al. |
| 5,777,919 A | 7/1998 | Chi-Yung et al. |
| 5,781,476 A | 7/1998 | Seki et al. |
| 5,781,478 A | 7/1998 | Takeuchi et al. |
| 5,783,934 A | 7/1998 | Tran |
| 5,784,314 A | 7/1998 | Sali et al. |
| 5,787,036 A | 7/1998 | Okazawa |
| 5,793,079 A | 8/1998 | Georgescu et al. |
| 5,801,076 A | 9/1998 | Ghneim et al. |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,822,256 A | 10/1998 | Bauer et al. |
| 5,825,683 A | 10/1998 | Chang et al. |
| 5,825,686 A | 10/1998 | Schmitt-Landsiedel et al. |
| 5,828,601 A | 10/1998 | Hollmer et al. |
| 5,834,851 A | 11/1998 | Ikeda et al. |
| 5,835,935 A | 11/1998 | Estakhri et al. |
| 5,836,772 A | 11/1998 | Chang et al. |
| 5,841,700 A | 11/1998 | Chang |
| 5,847,441 A | 12/1998 | Cutter et al. |
| 5,861,771 A | 1/1999 | Matsuda et al. |
| 5,862,076 A | 1/1999 | Eitan |
| 5,864,164 A | 1/1999 | Wen |
| 5,867,429 A | 2/1999 | Chen et al. |
| 5,870,334 A | 2/1999 | Hemink et al. |
| 5,870,335 A | 2/1999 | Khan et al. |
| 5,872,848 A | 2/1999 | Romney et al. |
| 5,875,128 A | 2/1999 | Ishizuka et al. |
| 5,877,537 A | 3/1999 | Aoki |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,920,503 A | 7/1999 | Lee et al. |
| 5,920,507 A | 7/1999 | Takeuchi et al. |
| 5,926,409 A | 7/1999 | Engh et al. |
| 5,930,195 A | 7/1999 | Komatsu et al. |
| 5,933,366 A | 8/1999 | Yoshikawa |
| 5,933,367 A | 8/1999 | Matsuo et al. |
| 5,936,888 A | 8/1999 | Sugawara |
| 5,940,332 A | 8/1999 | Artieri |
| 5,946,258 A | 8/1999 | Evertt et al. |
| 5,946,558 A | 8/1999 | Hsu |
| 5,949,711 A * | 9/1999 | Kazerounian .......... 365/185.05 |
| 5,949,714 A | 9/1999 | Hemink et al. |
| 5,949,728 A | 9/1999 | Liu et al. |
| 5,959,311 A | 9/1999 | Shih et al. |
| 5,963,412 A | 10/1999 | En |
| 5,963,465 A | 10/1999 | Eitan |
| 5,966,603 A | 10/1999 | Eitan |
| 5,969,989 A | 10/1999 | Iwahashi |
| 5,969,993 A | 10/1999 | Takeshima |
| 5,973,373 A | 10/1999 | Krautschneider et al. |
| 5,982,666 A | 11/1999 | Campardo |
| 5,986,940 A | 11/1999 | Atsumi et al. |
| 5,990,526 A | 11/1999 | Bez et al. |
| 5,991,202 A | 11/1999 | Derhacobian et al. |
| 5,991,517 A | 11/1999 | Harari et al. |
| 5,999,444 A | 12/1999 | Fujiwara et al. |
| 5,999,494 A | 12/1999 | Holzrichter |
| 6,000,006 A | 12/1999 | Bruce et al. |
| 6,005,423 A | 12/1999 | Schultz |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,037,627 A | 3/2000 | Kitamura et al. |
| 6,040,610 A | 3/2000 | Noguchi et al. |
| 6,044,019 A | 3/2000 | Cernea et al. |
| 6,044,022 A | 3/2000 | Nachumovsky |
| 6,063,666 A | 5/2000 | Chang et al. |
| 6,064,226 A | 5/2000 | Earl |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,117,714 A | 9/2000 | Beatty |
| 6,118,207 A | 9/2000 | Ormerod et al. |
| 6,118,692 A | 9/2000 | Banks |
| 6,122,198 A | 9/2000 | Haddad et al. |
| 6,128,226 A | 10/2000 | Eitan et al. |
| 6,128,227 A | 10/2000 | Kim |
| 6,130,452 A | 10/2000 | Lu et al. |
| 6,130,572 A | 10/2000 | Ghilardelli et al. |
| 6,130,574 A | 10/2000 | Bloch et al. |
| 6,133,095 A | 10/2000 | Eitan et al. |
| 6,134,156 A | 10/2000 | Eitan |
| 6,137,718 A | 10/2000 | Reisinger |
| 6,147,904 A | 11/2000 | Liron |
| 6,147,906 A | 11/2000 | Bill et al. |

| | | | | | | |
|---|---|---|---|---|---|---|
| 6,150,800 | A | 11/2000 | Kinoshita et al. | 6,351,415 B1 | 2/2002 | Kushnarenko |
| 6,154,081 | A | 11/2000 | Pakkala et al. | 6,353,356 B1 | 3/2002 | Liu |
| 6,156,149 | A | 12/2000 | Cheung et al. | 6,353,554 B1 | 3/2002 | Banks |
| 6,157,242 | A | 12/2000 | Fukui | 6,353,555 B1 | 3/2002 | Jeong |
| 6,157,570 | A | 12/2000 | Nachumovsky | 6,356,062 B1 | 3/2002 | Elmhurst et al. |
| 6,163,048 | A | 12/2000 | Hirose et al. | 6,356,469 B1 | 3/2002 | Roohparvar et al. |
| 6,163,484 | A | 12/2000 | Uekubo | 6,359,501 B2 | 3/2002 | Lin et al. |
| 6,169,691 | B1 | 1/2001 | Pasotti et al. | 6,374,337 B1 | 4/2002 | Estakhri |
| 6,175,519 | B1 | 1/2001 | Lu et al. | 6,385,086 B1 | 5/2002 | Mihara et al. |
| 6,175,523 | B1 | 1/2001 | Yang et al. | 6,396,741 B1 | 5/2002 | Bloom et al. |
| 6,181,597 | B1 | 1/2001 | Nachumovsky | 6,400,209 B1 | 6/2002 | Matsuyama et al. |
| 6,181,605 | B1 | 1/2001 | Hollmer et al. | 6,400,607 B1 | 6/2002 | Pasotti et al. |
| 6,185,143 | B1 | 2/2001 | Perner et al. | 6,407,537 B2 | 6/2002 | Antheunis |
| 6,188,211 | B1 | 2/2001 | Rincon-Mora et al. | 6,410,388 B1 | 6/2002 | Kluth et al. |
| 6,190,966 | B1 | 2/2001 | Ngo et al. | 6,417,081 B1 | 7/2002 | Thurgate |
| 6,192,445 | B1 | 2/2001 | Rezvani | 6,418,506 B1 | 7/2002 | Pashley et al. |
| 6,195,196 | B1 | 2/2001 | Kimura et al. | 6,426,898 B1 | 7/2002 | Mihnea et al. |
| 6,198,342 | B1 | 3/2001 | Kawai | 6,429,063 B1 | 8/2002 | Eitan |
| 6,201,282 | B1 | 3/2001 | Eitan | 6,433,624 B1 | 8/2002 | Grossnikle et al. |
| 6,201,737 | B1 | 3/2001 | Hollmer et al. | 6,436,766 B1 | 8/2002 | Rangarajan et al. |
| 6,205,055 | B1 | 3/2001 | Parker | 6,436,768 B1 | 8/2002 | Yang et al. |
| 6,205,056 | B1 | 3/2001 | Pan et al. | 6,438,031 B1 | 8/2002 | Fastow |
| 6,205,059 | B1 | 3/2001 | Gutala et al. | 6,438,035 B2 | 8/2002 | Yamamoto et al. |
| 6,208,200 | B1 | 3/2001 | Arakawa | 6,440,797 B1 | 8/2002 | Wu et al. |
| 6,208,557 | B1 | 3/2001 | Bergemont et al. | 6,442,074 B1 | 8/2002 | Hamilton et al. |
| 6,214,666 | B1 | 4/2001 | Mehta | 6,445,030 B1 | 9/2002 | Wu et al. |
| 6,215,148 | B1 | 4/2001 | Eitan | 6,448,750 B1 | 9/2002 | Shor et al. |
| 6,215,697 | B1 | 4/2001 | Lu et al. | 6,449,188 B1 | 9/2002 | Fastow |
| 6,215,702 | B1 | 4/2001 | Derhacobian et al. | 6,449,190 B1 | 9/2002 | Bill |
| 6,218,695 | B1 | 4/2001 | Nachumovsky | 6,452,438 B1 | 9/2002 | Li |
| 6,219,277 | B1 | 4/2001 | Devin et al. | 6,455,896 B1 | 9/2002 | Chou et al. |
| 6,219,290 | B1 | 4/2001 | Chang et al. | 6,456,528 B1 | 9/2002 | Chen |
| 6,222,762 | B1 | 4/2001 | Guterman et al. | 6,456,533 B1 | 9/2002 | Hamilton et al. |
| 6,222,768 | B1 | 4/2001 | Hollmer et al. | 6,456,539 B1 | 9/2002 | Nguyen et al. |
| 6,233,180 | B1 | 5/2001 | Eitan et al. | 6,458,656 B1 | 10/2002 | Park et al. |
| 6,240,032 | B1 | 5/2001 | Fukumoto | 6,458,677 B1 | 10/2002 | Hopper et al. |
| 6,240,040 | B1 | 5/2001 | Akaogi et al. | 6,469,929 B1 | 10/2002 | Kushnarenko et al. |
| 6,246,555 | B1 | 6/2001 | Tham | 6,469,935 B2 | 10/2002 | Hayashi |
| 6,252,442 | B1 | 6/2001 | Malherbe | 6,472,706 B2 | 10/2002 | Widdershoven et al. |
| 6,252,799 | B1 | 6/2001 | Liu et al. | 6,477,084 B1 | 11/2002 | Eitan |
| 6,256,231 | B1 | 7/2001 | Lavi et al. | 6,477,085 B1 | 11/2002 | Kuo |
| 6,261,904 | B1 | 7/2001 | Pham et al. | 6,490,204 B2 | 12/2002 | Bloom et al. |
| 6,265,268 | B1 | 7/2001 | Halliyal et al. | 6,496,414 B2 | 12/2002 | Kasa et al. |
| 6,266,281 | B1 | 7/2001 | Derhacobian et al. | 6,504,756 B2 | 1/2003 | Gonzalez et al. |
| 6,272,047 | B1 | 8/2001 | Mihnea et al. | 6,510,082 B1 | 1/2003 | Le et al. |
| 6,275,414 | B1 | 8/2001 | Randolph et al. | 6,512,701 B1 | 1/2003 | Hamilton et al. |
| 6,281,545 | B1 | 8/2001 | Liang et al. | 6,519,180 B2 | 2/2003 | Tran et al. |
| 6,282,133 | B1 | 8/2001 | Nakagawa et al. | 6,519,182 B1 | 2/2003 | Derhacobian et al. |
| 6,282,145 | B1 | 8/2001 | Tran et al. | 6,522,585 B2 | 2/2003 | Pasternak |
| 6,285,246 | B1 | 9/2001 | Basu | 6,525,969 B1 | 2/2003 | Kurihara et al. |
| 6,285,574 | B1 | 9/2001 | Eitan | 6,528,390 B2 | 3/2003 | Komori et al. |
| 6,285,589 | B1 | 9/2001 | Kajitani | 6,529,412 B1 | 3/2003 | Chen et al. |
| 6,285,614 | B1 | 9/2001 | Mulatti et al. | 6,532,173 B2 | 3/2003 | Lioka et al. |
| 6,292,394 | B1 | 9/2001 | Cohen et al. | 6,535,020 B1 | 3/2003 | Yin |
| 6,297,096 | B1 | 10/2001 | Boaz | 6,535,434 B2 | 3/2003 | Maayan et al. |
| 6,297,974 | B1 | 10/2001 | Ganesan et al. | 6,537,881 B1 | 3/2003 | Rangarajan et al. |
| 6,304,485 | B1 | 10/2001 | Harari et al. | 6,538,270 B1 | 3/2003 | Randolph et al. |
| 6,307,784 | B1 | 10/2001 | Hamilton et al. | 6,541,816 B2 | 4/2003 | Ramsbey et al. |
| 6,307,807 | B1 | 10/2001 | Sakui et al. | 6,552,387 B1 | 4/2003 | Eitan |
| 6,320,786 | B1 | 11/2001 | Chang et al. | 6,555,436 B2 | 4/2003 | Ramsbey et al. |
| 6,324,094 | B1 | 11/2001 | Chevallier | 6,559,500 B2 | 5/2003 | Torii |
| 6,326,265 | B1 | 12/2001 | Liu et al. | 6,562,683 B1 | 5/2003 | Wang et al. |
| 6,330,192 | B1 | 12/2001 | Ohba et al. | 6,566,194 B1 | 5/2003 | Ramsbey et al. |
| 6,331,950 | B1 | 12/2001 | Kuo et al. | 6,566,699 B2 | 5/2003 | Eitan |
| 6,335,874 | B1 | 1/2002 | Eitan | 6,567,303 B1 | 5/2003 | Hamilton et al. |
| 6,335,990 | B1 | 1/2002 | Chen et al. | 6,567,312 B1 | 5/2003 | Torii et al. |
| 6,337,502 | B1 | 1/2002 | Eitan et al. | 6,570,211 B1 | 5/2003 | He et al. |
| 6,339,556 | B1 | 1/2002 | Watanabe | 6,574,139 B2 | 6/2003 | Kurihara |
| 6,343,033 | B1 | 1/2002 | Parker | 6,577,514 B2 | 6/2003 | Shor et al. |
| 6,344,959 | B1 | 2/2002 | Milazzo | 6,577,532 B1 | 6/2003 | Chevallier |
| 6,346,442 | B1 | 2/2002 | Aloni et al. | 6,577,547 B2 | 6/2003 | Ukon |
| 6,348,381 | B1 | 2/2002 | Jong | 6,583,005 B2 | 6/2003 | Hashimoto et al. |
| 6,348,711 | B1 | 2/2002 | Eitan | 6,583,007 B1 | 6/2003 | Eitan |

| | | | | | | |
|---|---|---|---|---|---|---|
| 6,583,479 B1 | 6/2003 | Fastow et al. | | 6,917,544 B2 | 7/2005 | Maayan et al. |
| 6,584,017 B2 | 6/2003 | Maayan et al. | | 6,928,001 B2 | 8/2005 | Avni et al. |
| 6,590,811 B1 | 7/2003 | Hamilton et al. | | 6,930,928 B2 | 8/2005 | Liu et al. |
| 6,593,606 B1 | 7/2003 | Randolph et al. | | 6,937,523 B2 | 8/2005 | Eshel |
| 6,594,181 B1 | 7/2003 | Yamada | | 6,954,393 B2 | 10/2005 | Lusky et al. |
| 6,608,526 B1 | 8/2003 | Sauer | | 6,967,872 B2 | 11/2005 | Quader et al. |
| 6,608,905 B1 | 8/2003 | Muza et al. | | 6,967,896 B2 | 11/2005 | Eisen et al. |
| 6,614,052 B1 | 9/2003 | Zhang | | 6,996,692 B2 | 2/2006 | Kouno |
| 6,614,295 B2 | 9/2003 | Tsuchi | | 7,043,672 B2 | 5/2006 | Merritt |
| 6,614,686 B1 | 9/2003 | Kawamura | | 7,079,420 B2 | 7/2006 | Shappir et al. |
| 6,614,692 B2 | 9/2003 | Eliyahu et al. | | 7,116,577 B2 | 10/2006 | Eitan |
| 6,617,179 B1 | 9/2003 | Kim | | 2001/0006477 A1 | 7/2001 | Banks |
| 6,617,215 B1 | 9/2003 | Halliyal et al. | | 2002/0004878 A1 | 1/2002 | Norman |
| 6,618,290 B1 | 9/2003 | Wang et al. | | 2002/0004921 A1 | 1/2002 | Muranaka et al. |
| 6,624,672 B2 | 9/2003 | Confaloneri et al. | | 2002/0064911 A1 | 5/2002 | Eitan |
| 6,627,555 B2 | 9/2003 | Eitan et al. | | 2002/0132436 A1 | 9/2002 | Eliyahu et al. |
| 6,630,384 B1 | 10/2003 | Sun et al. | | 2002/0140109 A1 | 10/2002 | Keshavarzi et al. |
| 6,633,496 B2 | 10/2003 | Maayan et al. | | 2002/0145465 A1 | 10/2002 | Shor et al. |
| 6,633,499 B1 | 10/2003 | Eitan et al. | | 2002/0191465 A1 | 12/2002 | Maayan et al. |
| 6,633,956 B1 | 10/2003 | Mitani | | 2002/0199065 A1 | 12/2002 | Subramoney et al. |
| 6,636,440 B2 | 10/2003 | Maayan et al. | | 2003/0001213 A1 | 1/2003 | Lai |
| 6,639,271 B1 | 10/2003 | Zheng et al. | | 2003/0021155 A1 | 1/2003 | Yashareni et al. |
| 6,639,837 B2 | 10/2003 | Takano et al. | | 2003/0072192 A1 | 4/2003 | Bloom et al. |
| 6,639,844 B1 | 10/2003 | Liu et al. | | 2003/0076710 A1 | 4/2003 | Sofer et al. |
| 6,639,849 B2 | 10/2003 | Takahashi et al. | | 2003/0117841 A1 | 6/2003 | Yamashita |
| 6,642,148 B1 | 11/2003 | Ghandehari et al. | | 2003/0131186 A1 | 7/2003 | Buhr |
| 6,642,573 B1 | 11/2003 | Halliyal et al. | | 2003/0134476 A1 | 7/2003 | Roizin et al. |
| 6,642,586 B2 | 11/2003 | Takahashi | | 2003/0142544 A1 | 7/2003 | Maayan et al. |
| 6,643,170 B2 | 11/2003 | Huang et al. | | 2003/0145176 A1 | 7/2003 | Dvir et al. |
| 6,643,177 B1 | 11/2003 | Le et al. | | 2003/0145188 A1 | 7/2003 | Cohen et al. |
| 6,643,178 B2 | 11/2003 | Kurihara | | 2003/0155659 A1 | 8/2003 | Verma et al. |
| 6,643,181 B2 | 11/2003 | Sofer et al. | | 2003/0190786 A1 | 10/2003 | Ramsbey et al. |
| 6,645,801 B1 | 11/2003 | Ramsbey et al. | | 2003/0197221 A1 | 10/2003 | Shinozaki et al. |
| 6,649,972 B2 | 11/2003 | Eitan | | 2003/0202411 A1 | 10/2003 | Yamada |
| 6,650,568 B2 | 11/2003 | Iijima | | 2003/0206435 A1 | 11/2003 | Takahashi |
| 6,653,190 B1 | 11/2003 | Yang et al. | | 2003/0208663 A1 * | 11/2003 | Van Buskirk et al. ....... 711/156 |
| 6,653,191 B1 | 11/2003 | Yang et al. | | 2003/0209767 A1 | 11/2003 | Takahashi et al. |
| 6,654,296 B2 | 11/2003 | Jang et al. | | 2003/0214844 A1 | 11/2003 | Iijima |
| 6,664,588 B2 | 12/2003 | Eitan | | 2003/0214852 A1 | 11/2003 | Chang |
| 6,665,769 B2 | 12/2003 | Cohen et al. | | 2003/0218207 A1 | 11/2003 | Hashimoto et al. |
| 6,670,241 B1 | 12/2003 | Kamal et al. | | 2003/0218913 A1 | 11/2003 | Le et al. |
| 6,670,669 B1 | 12/2003 | Kawamura | | 2003/0222303 A1 | 12/2003 | Fukuda et al. |
| 6,674,138 B1 | 1/2004 | Halliyal et al. | | 2003/0227796 A1 | 12/2003 | Miki et al. |
| 6,677,805 B2 | 1/2004 | Shor et al. | | 2004/0007730 A1 | 1/2004 | Chou et al. |
| 6,680,509 B1 | 1/2004 | Wu et al. | | 2004/0012993 A1 | 1/2004 | Kurihara |
| 6,686,242 B2 | 2/2004 | Willer et al. | | 2004/0013000 A1 | 1/2004 | Torli |
| 6,690,602 B1 * | 2/2004 | Le et al. ................. 365/185.33 | | 2004/0014280 A1 | 1/2004 | Willer et al. |
| 6,693,483 B2 | 2/2004 | Deml et al. | | 2004/0014290 A1 | 1/2004 | Yang et al. |
| 6,700,818 B2 | 3/2004 | Shappir et al. | | 2004/0017717 A1 | 1/2004 | Morishima |
| 6,717,207 B2 | 4/2004 | Kato | | 2004/0021172 A1 | 2/2004 | Zheng et al. |
| 6,723,518 B2 | 4/2004 | Papsidero et al. | | 2004/0027858 A1 | 2/2004 | Takahashi et al. |
| 6,731,542 B1 | 5/2004 | Le et al. | | 2004/0117395 A1 | 6/2004 | Gong et al. |
| 6,738,289 B2 | 5/2004 | Gongwer et al. | | 2004/0136236 A1 | 7/2004 | Cohen |
| 6,744,692 B2 | 6/2004 | Shiota et al. | | 2004/0151034 A1 | 8/2004 | Shor et al. |
| 6,765,259 B2 | 7/2004 | Kim | | 2004/0153621 A1 | 8/2004 | Polansky et al. |
| 6,768,165 B1 | 7/2004 | Eitan | | 2004/0157393 A1 | 8/2004 | Hwang |
| 6,781,876 B2 | 8/2004 | Forbes et al. | | 2004/0222437 A1 | 11/2004 | Avni et al. |
| 6,788,579 B2 | 9/2004 | Gregori et al. | | 2004/0257873 A1 * | 12/2004 | Shieh et al. .............. 365/185.2 |
| 6,791,396 B2 | 9/2004 | Shor et al. | | 2005/0058005 A1 | 3/2005 | Shappir et al. |
| 6,794,249 B2 | 9/2004 | Palm et al. | | 2005/0078026 A1 | 4/2005 | Cal |
| 6,794,280 B2 | 9/2004 | Chang | | 2005/0117395 A1 | 6/2005 | Maayan et al. |
| 6,818,956 B2 | 11/2004 | Kuo et al. | | 2005/0117601 A1 | 6/2005 | Anderson et al. |
| 6,829,172 B2 | 12/2004 | Bloom et al. | | 2005/0140405 A1 | 6/2005 | Do et al. |
| 6,831,872 B2 | 12/2004 | Matsuoka | | 2005/0213593 A1 | 9/2005 | Anderson et al. |
| 6,836,431 B2 | 12/2004 | Chang | | 2005/0232024 A1 | 10/2005 | Atir et al. |
| 6,859,028 B2 | 2/2005 | Toner | | 2006/0084219 A1 | 4/2006 | Lusky et al. |
| 6,870,772 B1 | 3/2005 | Nitta et al. | | 2006/0126382 A1 | 6/2006 | Maayan et al. |
| 6,871,258 B2 | 3/2005 | Micheloni et al. | | 2006/0126983 A1 | 6/2006 | Shappir et al. |
| 6,885,585 B2 | 4/2005 | Maayan et al. | | | | |
| 6,885,590 B1 | 4/2005 | Zheng et al. | | FOREIGN PATENT DOCUMENTS | | |
| 6,906,357 B1 | 6/2005 | Vashchenko et al. | | | | |
| 6,912,160 B2 | 6/2005 | Yamada | | EP | 0751560 | 6/1995 |
| 6,917,541 B2 | 7/2005 | Shimbayashi et al. | | EP | 0693781 | 1/1996 |

| | | |
|---|---|---|
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

U.S. Appl. No. 11/489,327, filed Jul. 18, 2006, Eitan et al.
U.S. Appl. No. 11/440,624, filed May 24, 2006, Lusky et al.
U.S. Appl. No. 11/489,747, filed Jul. 18, 2006, Bloom et al.
U.S. Appl. No. 11/336,093, filed Jan. 20, 2006, Eitan et al.
Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583. vol. 31, No. 11.
Compardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide In n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma et al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 5 2 1-5 2 4, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12, Institute of Electrical and Electronics Engineers, Inc.
Martin, Improved Circuits for the Realization of Switched-Capacitor Filters, IEEE Transctions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Picker, Ion Implantation in Silicon—Physics, Processing, and Microelectroic Device, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35 No. 4B.
Umezawa, et al., A 5-V-Only Operation 0.6-~m Flash EEPROM with Row Decoder Scheme in Triple-Well Structure, IEEE Journal of Solid-State Circuits, 1992, 1540, vol. 27.
Mitchell, et al., A new self-aligned planar array cell for ultra high density EPROMS, 1987.
"SONOS Novolatile Semiconductor Memories for Space and Military Applications", Adams et al., Symposium, 2000. http://klabs.org/richcontent/MemoryContent/nvmt_symp/nvmts_2000/papers/adams_d.pdf.
"Philips Research—Technologies—Embedded Nonvolatile Memories" http://research.philips.com/technologies/ics/nvmemories/index.html.
"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

Esquivel, et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen, et al., CMOS Analog Circuit Design, 2002, 259pages, Oxford University Press.

Klinke, et al., A very-high-slew-rate CMOS operational amplifier, IEEE Journal of Solid-State Circuits, 1989, 744-746, 24 vol.

Shor, et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, ch. 2, "A Wiley-Interscience Publication", John Wiley & Sons Publishers.

Chang, Non Volatile Semiconductor Memory Devices, Proceedings of the IEEE, 64 vol., No. 7 , pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al. Novel Dual Bit Tri- Gate Charge Trapping Memory Devices, IEEE Electron Device Lettes, vol. 25, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

* cited by examiner

OPERATING ARRAY CELLS WITH MATCHED REFERENCE CELLS

CROSS-REFERENCE TO RELATED APPLICATIONS

This application is continuation of U.S. patent application Ser. No. 11/194,394, filed Aug. 1, 2005 now U.S Pat. No. 7,123,532 which is a continuation-in-part application claiming benefit from U.S. patent application Ser. No. 10/662,535, filed Sep. 16, 2003, now U.S Pat. No. 6,954,393, which is hereby incorporated by reference.

FIELD OF THE INVENTION

The present invention relates generally to operating memory cells of non-volatile memory arrays, and particularly to methods for operating multi-bit memory cells with respect to reference cells.

BACKGROUND OF THE INVENTION

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of 1) and if the current output is below the reference, the cell is considered programmed (with a logical value of 0). (In terms of the threshold voltage of the cell itself, programming a cell increases the threshold voltage of the cell, whereas erasing decreases the threshold voltage.)

Typically, a sufficient difference is defined between the expected erased and programmed voltage levels so that noise on the output will not cause false results. Accordingly, a program verify (PV) reference level and an erase verify (EV) reference level may be defined with a sufficient margin therebetween.

The margin may help maintain the same reading for the programmed or erased state of the cell. The margin may be necessary to overcome imperfections in the reading process and to compensate for drifts in the cell's threshold voltage (e.g., caused by retention loss or program/erase disturbs). A reduction in the original margin due to imperfections in the reading process (e.g., due to operation at different operational conditions) is referred to as "margin loss."

Many NVM arrays employ a reference cell as the basis for comparing the output of an array cell for a read operation. The use of a reference cell may help compensate for changes in the array, e.g., due to voltage variations and temperature, and ensure a fairly stable reference for read operations.

As is well known, NVM cells may have more than one bit, such as dual-bit or multi-bit cells. One example of a dual or multi-bit cell is a nitride, read only memory (NROM) cell, described in such patents as Applicant's U.S. Pat.; No. 6,490,204, entitled "Programming And Erasing Methods For An NROM Array", and Applicant's U.S. Pat. No. 6,396,741, entitled "Programming Of Nonvolatile Memory Cells", the disclosures of which are incorporated herein by reference. Programming an NROM cell may typically involve applying positive voltages to gate and drain terminals of the transistor, while the source may be grounded. Erasing an NROM cell, which is done in the same source/drain direction as programming, typically involves applying a negative voltage to the gate and a positive voltage to the drain, while the source may be floated.

In dual-bit NROM cells, each bit may be read in the direction opposite to that of its programming direction, referred to as a "reverse read". For convenience of explanation, the bits are referred to as the left bit and the right bit. Accordingly, in order to read the left bit, the right bit line is the drain and the left bit line is the source. Conversely, in order to read the right bit, the cell is read in the opposite direction, meaning that the left bit line is the drain and the right bit line is the source.

The left bit and the right bit may be at different programmed states. For example, one of the bits may be programmed while the other may be erased. When reading one of the bits in the cell, voltages are applied to the bit lines and word line to which the drain, source and gate terminals of the memory cell are connected. In order to prevent the unread bit from erroneously affecting or disturbing the bit being read, it is generally accepted that a relatively large drain-source voltage Vds (e.g., above 1.4 V) should be applied. Such a high Vds ensures that the bit not being read has negligible effect on the bit being read.

However, using a relatively high drain to source voltage during read is not free of problems. Such a high Vds may cause a read disturb effect on the second bit of the dual bit cell, causing its threshold voltage to increase. For example, FIG. 1 illustrates the time for the threshold voltage (Vt) to drift upwards by 100 mV as a function of the drain-source voltage (Vds). For example, for Vds of about 1.6 V, it would take about $3 \times 10^7$ seconds for the threshold voltage to drift up approximately 100 mV. It is seen that as the drain-source voltage Vds increases, the time for the threshold voltage to drift upwards by 100 mV decreases. In other words, the higher the Vds, the quicker the threshold voltage drifts upwards. After a large number of read cycles, the threshold voltage may drift up an intolerable amount, leading to erase margin loss, i.e., a loss in the margin of voltage level between the erased state voltage level and the read reference level.

SUMMARY OF THE PRESENT INVENTION

There is therefore provided, in accordance with a preferred embodiment of the present invention, a method including programming a first storage area of a multi-bit reference cell to a reference level and programming a second storage area of the reference cell to a second programmed level. During operation, the method includes comparing an output of a memory cell to an output of the multi-bit reference cell when reading the reference level.

Additionally, in accordance with a preferred embodiment of the present invention, the reference level and the second programmed level may be substantially equal or different.

Moreover, in accordance with a preferred embodiment of the present invention, the operation may be reading, program verifying or erase verifying and the reference cell may be a read reference cell, a program verify reference cell or an erase verify reference cell.

Further, in accordance with a preferred embodiment of the present invention, the reference cell may be a nitride read only memory (NROM) cell. It may store charge in a non-nitride layer. It may have two storage areas and/or a physical separation between the two storage areas.

Still further, in accordance with a preferred embodiment of the present invention, memory cell may have more than 2 analog levels.

There is also provided, in accordance with a preferred embodiment of the present invention, a method including creating a multi-bit reference cell which is minimally sensitive to temperature and during operation, comparing an output of a memory cell to an output of the multi-bit reference cell when reading the reference level.

Additionally, in accordance with a preferred embodiment of the present invention, the creating comprises programming at least two storage areas of the reference cell. The may include programming a first storage area to a reference level and programming a second storage area to a second programmed level.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
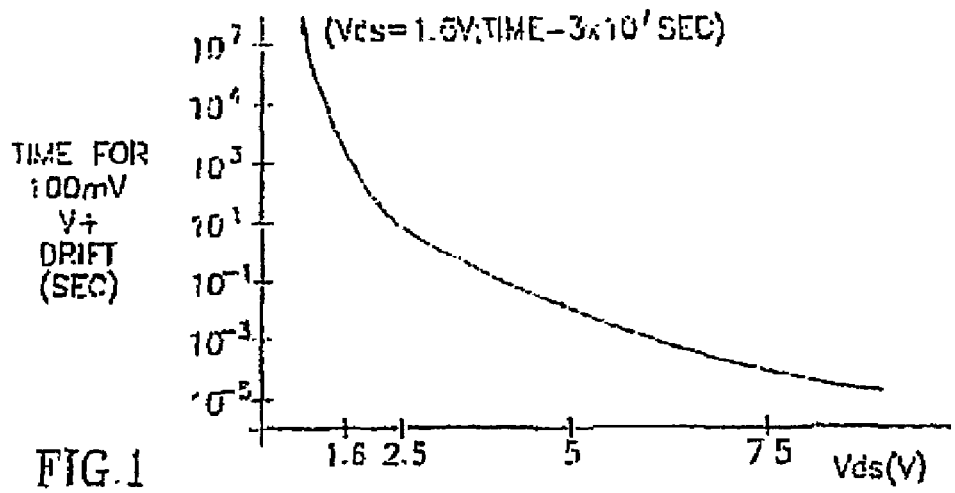
FIG. 1 is a simplified graphical illustration of the time required for a 100 mV threshold voltage upward drift of a NVM cell as a function of the drain-source voltage used in reading the cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2:
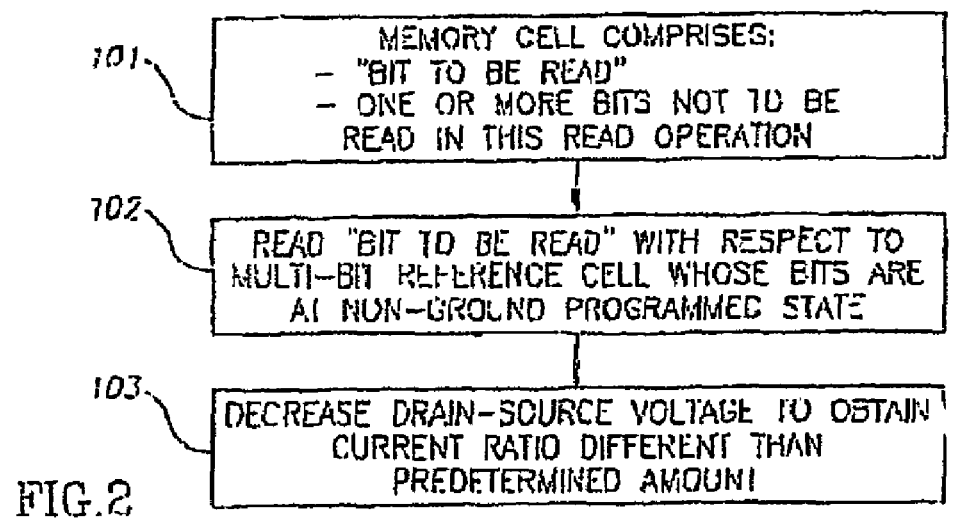
FIG. 2 is a simplified flow chart of a method for reading a bit of a memory cell, in accordance with an embodiment of the present invention.

Reference is now made to FIG. 2, which illustrates a method for reading a bit of a memory cell, in accordance with an embodiment of the present invention. The memory cell may comprise a bit to be read, and one or more other bits which are not to be read during this read operation (reference number 101 in FIG. 2). The other bits which are not read may be at erase or programmed states. The bit to be read may be in an erased state, which means that its threshold voltage is below a read reference level.

In the prior art, the bit to be read is read with respect to a first bit of a reference cell, which is at a read reference voltage level. A second bit of the reference cell is at an initial, unprogrammed state. In the initial state, the source is at or close to ground and ideally should remain close to ground. However, in real-world conditions that are not perfect, this initial state does not remain constant. For example, due to sensing and architecture array limitations, the source voltage generally increases during read operations. This may distort the sensed data due to a mismatch between the reference cell and the array cell.

In contrast, in the present invention, the bit to be read is read with respect to a multi-bit reference cell (in this example, a dual-bit reference cell) whose first bit is at a first read reference voltage level (i.e., a first non-ground programmed state), and whose second bit is at some non-ground (at least partially) programmed state, such as a second read reference voltage level (reference number 102 in FIG. 2). The second read reference voltage level may or may not be the same as the first read reference voltage level.

Figure 3:
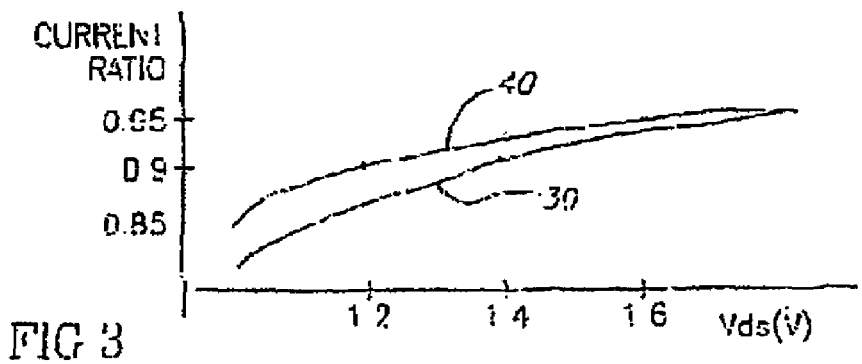
FIG. 3 is a simplified graphical illustration of a ratio of the sensed output current of an array cell to the current of a reference cell used to read the array cell, as a function of the drain-source voltage used to read the cell, in accordance with an embodiment of the invention.

Reference is now made to FIG. 3, which illustrates a ratio of the sensed output current of an array cell to the current of the reference cell used to read the array cell (referred to herein as the "current ratio"), as a function of the drain-source voltage (Vds) used to read the cell, in accordance with an embodiment of the invention.

In the design of a NVM array, it may be desirable to obtain a current ratio of a certain maximum magnitude, that is, a certain tolerable and acceptable current ratio loss. FIG. 3 illustrates an advantage of the present invention over the prior art, as is now explained.

Graph 30 is a plot of the current ratio vs. Vds for the case of reading an array cell whose first bit is at an erase/read level and whose second bit is programmed (that is, RD_PV) with respect to a reference cell of the prior art, whose first bit is at a read reference voltage level and whose second bit is at an initial, unprogrammed state (that is, RD_I). It is seen that for a given minimum current ratio, such as, for example, 0.90, in such a prior art read operation, Vds must be greater than or equal to 1.4 V.

Graph 40 is a plot of the current ratio vs. Vds for reading the same array cell (RD_PV) with respect to a reference cell of the present invention, whose first bit is at a first read reference voltage level and whose second bit is programmed to a read state (that is, RD_RD). It is seen that in order to attain the same minimum current ratio (in this example, 0.90), Vds needs only to be about 1.2 V. Thus, for a given current ratio loss, the invention enables application of a lower Vds. In other words, Vds may be decreased to obtain a different current ratio, such as greater than or equal to a predetermined amount (reference number 103 in FIG. 2). This also diminishes the read disturb effect on the second bit of the dual bit cell.

Applicants have further realized that, during operations other than reading, an array cell may be compared to other kinds of reference cells, typically by comparing current flow. For example, reference cells may be utilized during erase and programming operations to indicate the levels which define the erased and programmed states, respectively. These levels, known as erase verify (EV) and program verify (PV), respectively, may be utilized to decide on the conditions by which program and erase operations are concluded.

Figure 4:
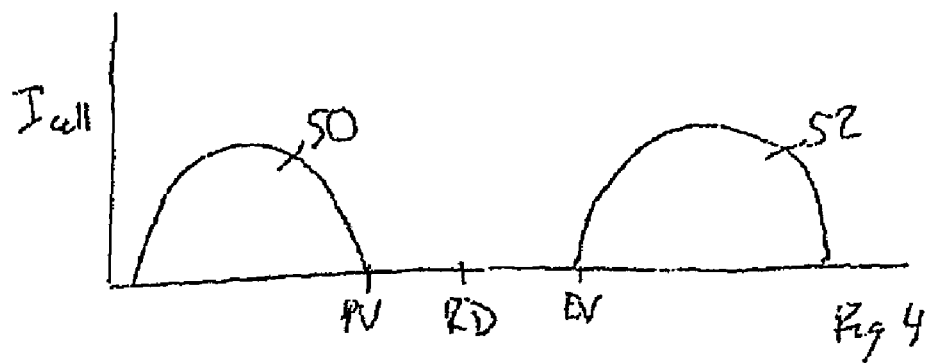
FIG. 4 is a schematic illustration of the reference levels used to operate array cells.

FIG. 4, to which reference is now made, illustrates three reference levels, program verify (PV), erase verify (EV) and read (RD) as a function of cell current. FIG. 4 also shows two distributions, a distribution 50 of programmed cells and a distribution 52 of erased cells. In this initial set of distributions (i.e. before the array is utilized), all of the erased cells have cell currents $I_{cell}$ above the erase verify level and all of the programmed cells have cell currents $I_{cell}$ below the program verify level.

To generate the distributions of FIG. 4, during programming, a sequence of programming pulses may be applied to the cell. During this sequence, the array cell may be read with respect to a program verify reference cell. If the current output of the NVM cell is above the current output of the program verify reference cell, the array cell may be considered "not programmed" and the programming pulse sequence may continue. However, if the current output of the array cell is below that of the program verify reference cell, the cell may be considered "program verified" and the programming sequence may stop.

For erasure, the erase pulse sequence may be applied to the array cell until the current of the array cell is larger than that of the erase verify reference cell. At that point, the array cell may be "erase verified" and the erase sequence may stop.

There may be further reference cells defining other reference levels to support different operations in the array.

Applicants have realized that it is important that a reference cell act similarly to the array cells under most, if not all, conditions and levels. Thus, if an array cell changes cell current, the reference array cell should change accordingly, in order for the comparison to maintain its usefulness. For example, an array cell programmed or erased at high temperature and re-measured at low temperature should generate similar results to an array cell programmed or erased at low temperature and re-measured at low temperature.

Figure 5B:
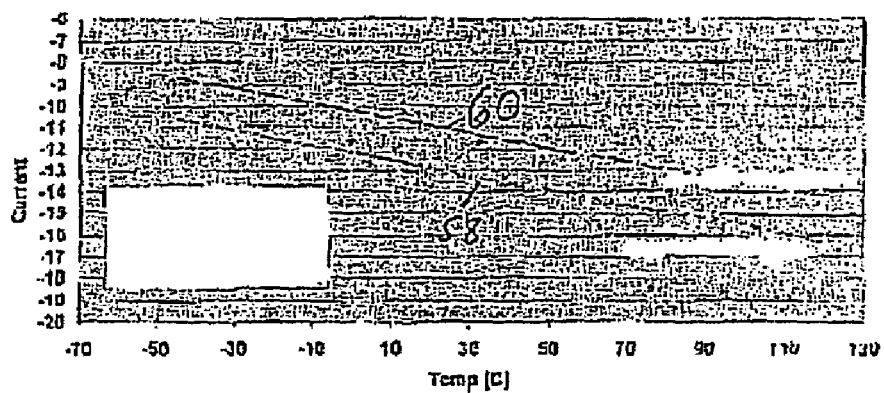
FIG. 5B is a graphical illustration of the effect of temperature in the prior art on the current of a program verify reference cell and a programmed cell.
Figure 5A:
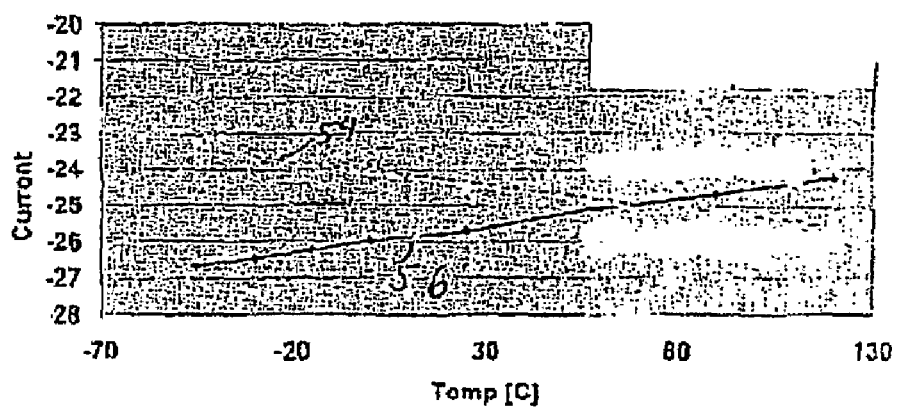
FIG. 5A is a graphical illustration of the effect of temperature in the prior art on the current of a erase verify reference cell and an erased cell.

Applicants have discovered that the prior art reference cells may be sensitive to temperature changes. This can be seen in FIGS. 5A and 5B, to which reference is now made. Both figures graph current of a reference cell and an array cell as a function of temperature. FIG. 5A graphs such for the erase verify reference cell (curve 54) and an erased cell (curve 56) and FIG. 5B graphs such for the program verify reference cell (curve 58) and a programmed cell (curve 60).

As can be seen in FIG. 5A, curves 54 and 56 cross and thus, there is a mismatch between the current change in the erase verify reference cell and in the erased cell. This is not true for the programming case. Curves 58 and 60 have similar slopes and thus, there is a good match between the current change in the program verify reference cell and in the programmed cell.

It can be inferred that, for higher temperatures, the program verify cell current may be increased and the erase verify cell current may be decreased. In this case, the margin between the two (i.e. the spread between the erase verify level and the program verify level) may be reduced and the reliability of the array may be degraded.

The different responses to temperature of the erase and program verify reference cells may result in program and erase verify decisions that are temperature dependent. For example, an array cell programmed or erased at high temperature and re-measured at low temperature may result in a different cell current than an array cell programmed or erased at low temperature and re-measured at low temperature. These temperature dependent decisions may degrade the program to erase margin of the array.

Furthermore, the read reference cell may also respond differently to temperature. This may affect the erase to read and program to read margins.

In accordance with a preferred embodiment of the present invention, the temperature sensitivity of multi-level reference cells may reduced. Reference cells which have two storage areas may have both storage areas programmed, possibly to different levels. One storage area may be programmed to the desired reference level. The second storage area may be programmed a minimal amount. The programming of the second storage area may help to reduce temperature sensitivity of the reference cells.

The reference cells may be any suitable multi-bit cells. For example, they may be NROM cells, such as those described hereinabove with respect to FIGS. 1-3, or they may be other types of NVM cells which store charge in a non-nitride layer. Alternatively, they may have a physical separation between the two storage areas. Furthermore, the multiple bits may be defined by having multiple threshold levels for each storage area, where each threshold level defines one end of a range for a different bit.

Figure 6:
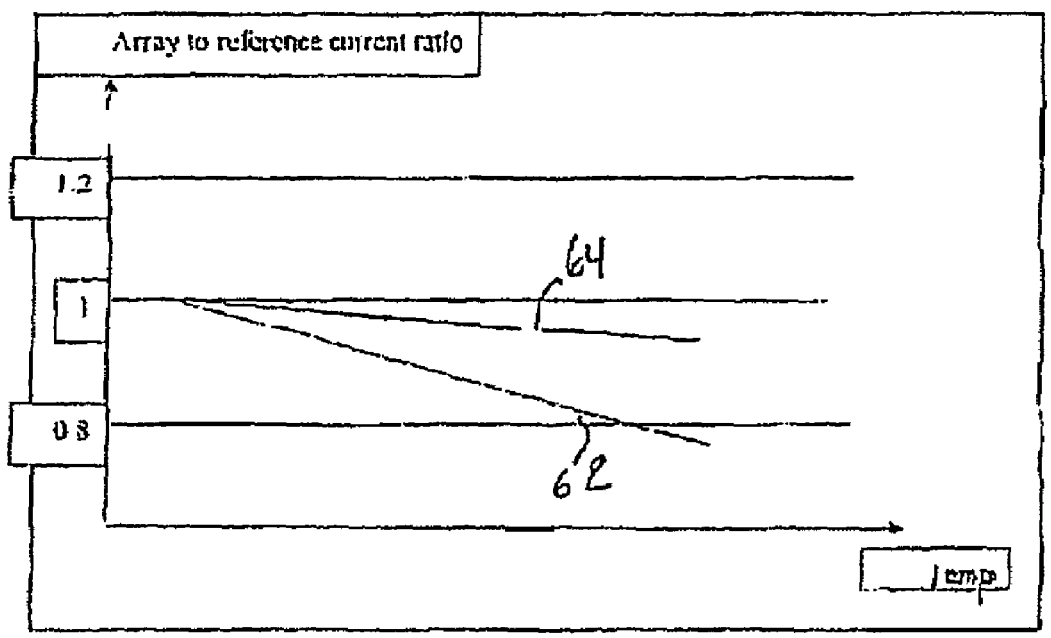
FIG. 6 is a graphical illustration of the current ratio of array erased cells to reference cells of prior art and to a reference cell of the present invention.

Reference is now made to FIG. 6, which graphs the current ratio vs. temperature for reading an erased array cell with respect to an erase verify reference cell of the present invention. For curve 62, the EV reference cell has one storage area programmed to the erase reference level and one non-programmed storage area. For curve 64, the reference cell has two programmed storage areas programmed to a level other than the ground level. For curve 64, the reference cell had one storage area programmed to the erase reference level while its second storage area was programmed to a level similar to that of a programmed reference cell.

It can be seen that curve 64 changes with temperature, but its slope is small (about 0.93) while curve 62 has a much larger slope (about 0.78). Thus, the reference cell whose second storage area is also programmed is less sensitive to temperature. It will be appreciated that programming the second storage area of any of the reference cells to some programming level, which may be the same or different than the programming level needed to provide the reference level, may reduce temperature sensitivity. This may improve the margins of operation in the memory array.

It will be appreciated by persons skilled in the art that the present invention is not limited by what has been particularly shown and described herein above. Rather the scope of the invention is defined by the claims that follow:

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory ("NVM") device comprising:
   a set of multi-charge storage region data cells; and
   a set of multi-charge-storage-region references cells, wherein at least one of said set of multi-charge storage reference cells has a thermal coefficient substantially correlated with a thermal coefficient value associated with a subset of said set of data cells, wherein said subset of data cells is associated with a specific logical state.

2. The device according to claim 1, wherein said set of data cells is comprised of Nitride Read Only Memory ("NROM") cells.

3. The device according to claim 1, wherein said set of cells is comprised of NROM cells.

4. The device according to claim 1, wherein said set of data cells and set of reference cells are comprised of charge trapping cells.

5. The device according to claim 1, wherein said set of data cells and reference cells are charge trapping cells which store the charge in a non-Nitride material.

6. The device according to claim 1, wherein said set of reference cells includes at least one multi-charge-storage-region cell having a first charge storage region charged to a threshold level associated with a logical state and a second charge storage region partially charged to adjust the at least one cell's temperature coefficient.

7. The device according to claim 1, wherein only one storage region of a multi-charge-storage-region cell is used during the device's operation.

8. The device according to claim 7, wherein said set of reference cells includes at least one multi-charge-storage-region cell having a first charge storage region charged to a threshold level associated with a logical state and a second charge storage region partially charged to adjust the at least one cell's temperature deviations.

9. The device according to claim 6, wherein said set of data cells is comprised of Nitride Read Only Memory ("NROM") cells.

10. The device according to claim 6, wherein said set of reference cells is comprised of NROM cells.

11. A non-volatile memory device comprising multi-charge storage data memory cells and at least one multi-charge storage reference cell, wherein said at least one multi-charge storage reference cell has a negative temperature coefficient; and during operation, comparing a signal generated by one of said data memory cells to a signal generated by said at least one multi-charge storage reference cell.

12. The device according to claim 11, wherein said at least one multi-charge storage reference cell has at least two storage areas which are in a non-native state.

13. A non-volatile memory device comprising multi-charge storage data memory cells and at least one multi-charge storage reference cell, wherein said at least one multi-charge storage reference cell has a positive temperature coefficient; and during operation, comparing a signal generated by one of said data memory cells to a signal generated by said at least one multi-charge storage reference cell.

14. The device according to claim 13, wherein said at least one multi-charge storage reference cell has at least two storage areas which are in a non-native state.

15. A non-volatile memory device comprising: multi-charge storage data memory cells and at least one multi-charge storage reference cell, wherein said at least one multi-charge storage reference cell has a close to zero temperature coefficient; and during operation, comparing a signal generated by one of said data memory cells to a signal generated by said at least one multi-charge storage reference cell.

16. The device according to claim 15, wherein said at least one multi-charge storage reference cell has at least two storage areas which are in a non-native state.

17. A method of producing a multi-level reference cell for use with a set of data cells, said method comprising:
correlating a thermal coefficient of said multi-level reference cell with a thermal coefficient value associated with the data cells.

18. The method according to claim 17, wherein said correlating comprises programming at least two storage areas of said reference cell.

19. The method according to claim 18, wherein said programming comprises programming a first storage area to a reference level and programming a second storage area to a second programmed level.

20. The method according to claim 19, wherein said reference level and said second programmed level are substantially equal.

21. The method according to claim 19, wherein said reference level and said second programmed level are not equal.

22. The method according to claim 17, wherein said reference cell is selected from the group consisting of a read reference cell, a program verify reference cell and an erase verify reference cell.

23. The method according to claim 17, wherein said reference cell comprises a nitride read only memory (NROM) cell.

24. The method according to claim 17, wherein said reference cell stores charge in a non-nitride layer.

25. The method according to claim 17, wherein said reference cell comprises two storage areas and a physical separation between said two storage areas.

26. The method according to claim 17 wherein said memory cell has more than 2 analog threshold voltage levels.

* * * * *